United States Patent
Gebhardt et al.

(10) Patent No.: US 6,867,592 B2
(45) Date of Patent: Mar. 15, 2005

(54) MAGNETIC RESONANCE APPARATUS AND CARRIER DEVICE EQUIPABLE WITH SHIM ELEMENTS

(75) Inventors: Matthias Gebhardt, Erlangen (DE); Norbert Gebhardt, Kirchehrenbach (DE); Johann Schuster, Oberasbach (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/425,445

(22) Filed: Apr. 29, 2003

(65) Prior Publication Data

US 2003/0206018 A1 Nov. 6, 2003

(30) Foreign Application Priority Data

May 2, 2002 (DE) .......................................... 102 19 769

(51) Int. Cl.⁷ ................................................. G01V 3/00
(52) U.S. Cl. ........................................ 324/318; 324/309
(58) Field of Search ............................... 324/318–322; 335/216; 29/605, 606

(56) References Cited

U.S. PATENT DOCUMENTS

| | | | | |
|---|---|---|---|---|
| 5,278,502 A | * | 1/1994 | Laskaris et al. | 324/318 |
| 5,369,387 A | * | 11/1994 | Woods et al. | 335/216 |
| 5,424,643 A | | 6/1995 | Morich et al. | 324/318 |
| 5,489,848 A | * | 2/1996 | Furukawa | 324/318 |
| 5,550,472 A | * | 8/1996 | Richard et al. | 324/320 |
| 5,635,839 A | * | 6/1997 | Srivastava et al. | 324/320 |
| 5,786,695 A | | 7/1998 | Amor et al. | 324/320 |
| 6,011,394 A | * | 1/2000 | Petropoulos et al. | 324/318 |
| 6,236,207 B1 | | 5/2001 | Arz et al. | 324/318 |
| 6,311,389 B1 | * | 11/2001 | Uosaki et al. | 29/605 |
| 6,774,631 B2 | * | 8/2004 | Heid | 324/318 |
| 2001/0033168 A1 | * | 10/2001 | Heid | 324/322 |
| 2003/0206018 A1 | * | 11/2003 | Gebhardt et al. | 324/318 |

FOREIGN PATENT DOCUMENTS

| | | |
|---|---|---|
| DE | 197 22 211 | 8/1998 |
| GB | 2319845 | 6/1998 |
| GB | 2382144 | 5/2003 |

OTHER PUBLICATIONS

Patent Abstracts of Japan—Publication No. 0821568 for Application Numhber 07029216.

* cited by examiner

*Primary Examiner*—Diego Gutierrez
*Assistant Examiner*—Tiffany A. Fetzner
(74) *Attorney, Agent, or Firm*—Schiff Hardin LLP

(57) ABSTRACT

A magnetic resonance apparatus has a receptacle space for the acceptance of at least one carrier device equipable with shim elements and at least one hollow member for conducting a coolant that cools the shim elements, a carrier device equipable with shim elements is designed forming at least one hollow member for conducting a coolant that cools the shim elements.

19 Claims, 5 Drawing Sheets

MAGNETIC RESONANCE APPARATUS AND CARRIER DEVICE EQUIPABLE WITH SHIM ELEMENTS

BACKGROUND OF THE INVENTION

1. Field of the Invention

The present invention is directed to a magnetic resonance apparatus and to a carrier device equipable with shim elements.

2. Description of the Prior Art

Magnetic resonance technology is a known technology for, among other things, acquiring images of the inside of the body of an examination subject. In a magnetic resonance apparatus, rapidly switched gradient fields are generated by a gradient coil system and are superimposed on a static basic magnetic field that is generated by a basic field magnet. The magnetic resonance apparatus also has a radio-frequency system that emits radio-frequency signals into the examination subject for triggering magnetic resonance signals and picks up the resulting magnetic resonance signals, on the basis of which magnetic resonance images are produced.

A high homogeneity of the basic magnetic field is a critical factor for the quality of the magnetic resonance images. Inhomogeneities of the basic magnetic field within a homogeneity volume of the magnetic resonance apparatus cause geometrical distortions of the magnetic resonance image that are proportional to the inhomogeneities. Shim systems are employed for improving the basic magnetic field homogeneity within the homogeneity volume. A distinction is made between passive and active shim systems. In a passive shim system, a number of laminae composed of a magnetic material, particularly a ferromagnetic iron alloy, are attached in the examination space of the magnetic resonance apparatus in a suitable arrangement. To that end, the basic magnetic field is measured within the homogeneity volume before the attachment of the laminae. Using the measured values, a computer program determines the suitable number and arrangement of the laminae.

U.S. Pat. No. 5,786,695 discloses an essentially hollow-cylindrical magnetic resonance apparatus having an essentially hollow-cylindrical gradient coil system. Between its gradient coils and the appertaining shielding coils, the gradient coil system has an essentially hollow-cylindrical receptacle space for carrier devices that are equipable with shim elements. The carrier devices roughly correspond in length to the longitudinal extent of the gradient coil system and are secured to a part of the gradient coil system at the side of the shielding coil. The carrier devices uniformly distributed in circumferential direction of the gradient coil system. Since a constant temperature of the shim elements is important for maintaining a constant precision of the shim effect, the carrier devices are designed in the following way: Toward that the shielding coil side of the gradient coil system, the carrier devices have two flow-through webs in the longitudinal direction so that cylindrical cavities extending in the longitudinal direction are formed limited by the webs, the part of the gradient coil system at the side of the shielding coil and the actual carrier device. Air can be blown through these cavities for cooling purposes. Among other things, heat generated in the gradient coil system can be carried off effectively from the shim elements.

SUMMARY OF THE INVENTION

An object of the invention is to provide a magnetic resonance apparatus and a carrier device equipable with shim elements allowing a high temperature stability of the shim elements to be achieved.

This object is achieved in accordance with the invention in a magnetic resonance apparatus having a receptacle space for accepting at least one carrier device equipable with shim elements and at least one hollow member for conducting a coolant that cools the shim elements. This object also is achieved in accordance with the invention in a carrier device equipable with shim elements designed to form at least one hollow member for conducting a coolant that cools the shim elements.

As a result, a gaseous or liquid coolant can be conducted optimally close to the shim elements on all sides, so substantial heat elimination and, as a result, a high temperature stability of the shim elements, are thus achieved.

DESCRIPTION OF THE PREFERRED EMBODIMENTS

Figure 1:
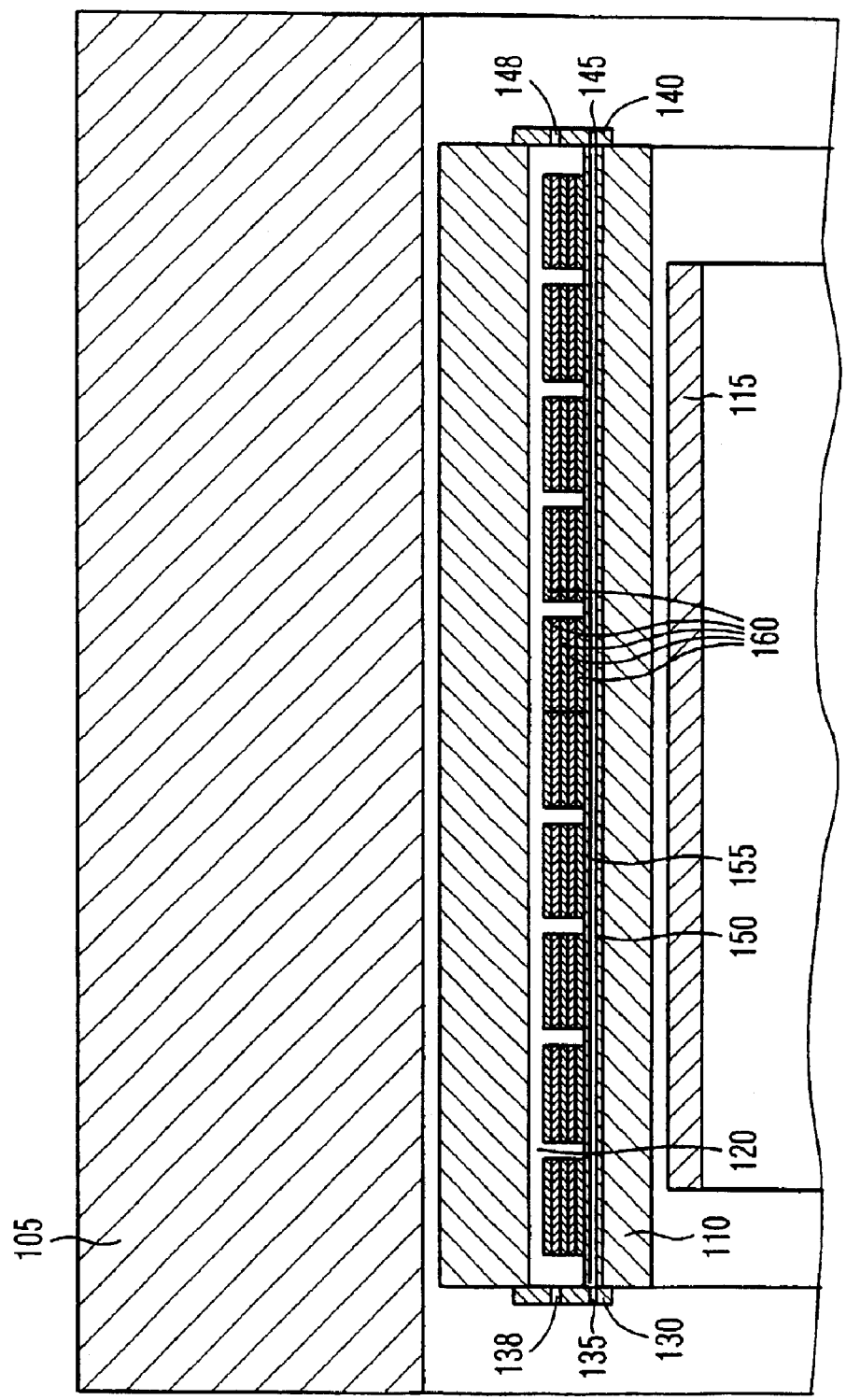
FIG. 1 is a longitudinal section through an upper region of the magnetic resonance apparatus according to the invention.
Figure 2:
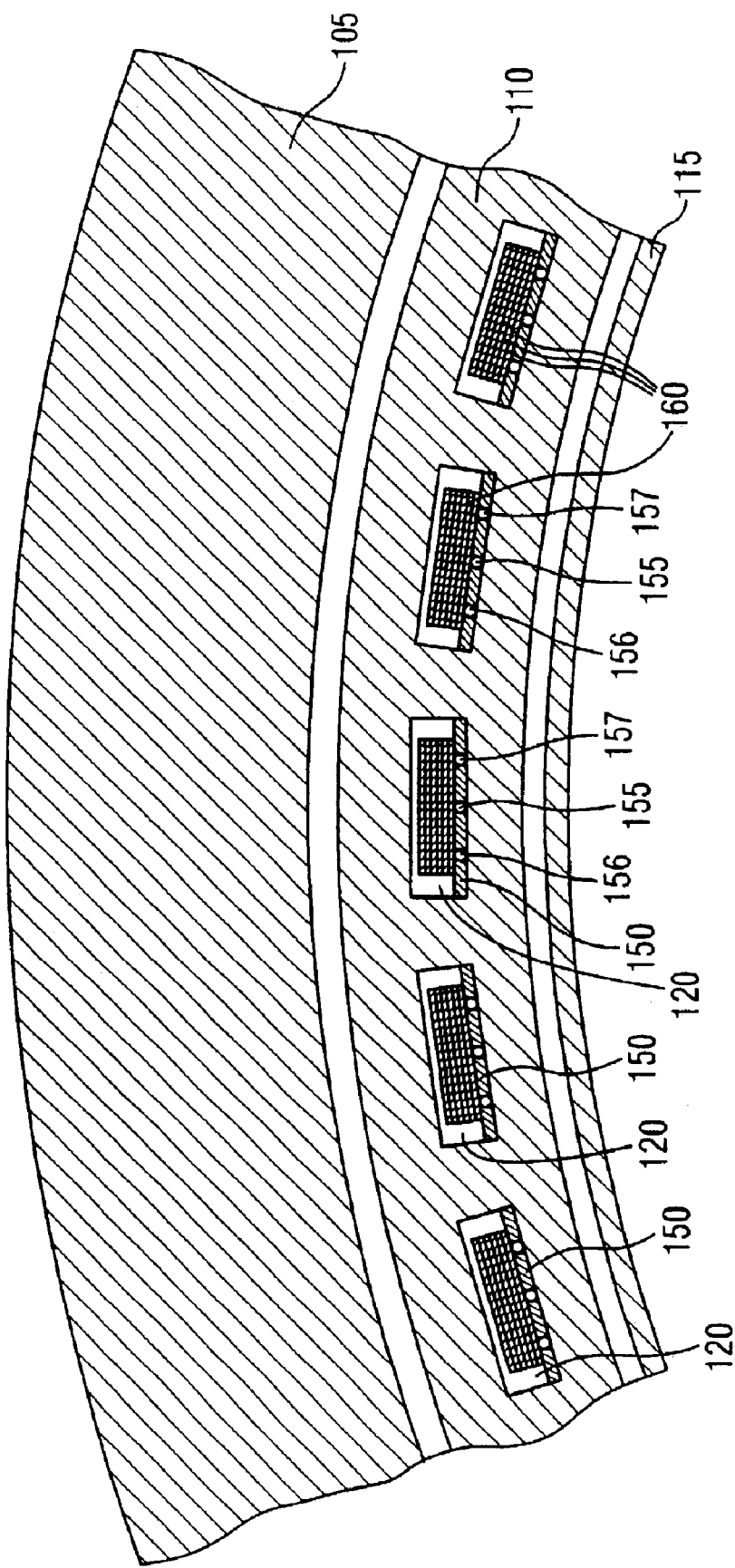
FIG. 2 is a sector of the upper region of FIG. 1 shown as a cross-section through the middle of the magnetic resonance apparatus.

As an exemplary embodiment of the invention, FIG. 1 shows a longitudinal section through an upper region of a magnetic resonance apparatus. FIG. 2 shows a sector of the upper region of the apparatus of FIG. 1, as cross-section through the middle of the magnetic resonance apparatus. The magnetic resonance apparatus thereby has an essentially hollow-cylindrical, superconducting basic field magnet 105 with which an optimally homogeneous, static basic magnetic field can be generated at least in an imaging volume arranged in the interior of the basic field magnet 105. A likewise essentially hollow-cylindrical gradient coil system 110, with which rapidly switchable gradient fields can be generated within the imaging volume is arranged in the interior of the basic field magnet 105. An essentially hollow-cylindrical antenna 115 is arranged in the interior of the gradient coil system 110. Radio-frequency signals can be emitted into an examination subject disposed in the imaging volume with the antenna 115 and the triggered magnetic resonance signal, from which magnetic resonance images can be produced, can be picked up by the antenna 115.

For, among other things, accepting carrier devices 150 equipable with shim elements 160, the gradient coil system 110 has cylindrical receptacle spaces 120 separate from one another and distributed in the circumferential direction of the gradient coil system 110. The spaces 120 pass completely through the gradient coil system 110 in the longitudinal direction and are identically radially spaced with reference to the principal axis of the hollow cylinder. One of these receptacle spaces 120 is shown longitudinally sectioned in FIG. 1. Each receptacle space 120 has a rectangular cross-section, as shown in FIG. 2. The individual shim elements are secured on the carrier devices 150 by gluing or screwing. The carrier devices 150 are composed of a highly thermally conductive plastic, and are designed to form three hollow members 155, 156, 157 (hollow members 156 and 157 not being visible in FIG. 1 but being shown in FIG. 2) that proceed completely through in the longitudinal direction.

The receptacle spaces 120 are closed at both ends with respective end caps 130 and 140, the end caps 130 and 140 having openings 135, 138, 145 and 148. The openings 135 and 145 of the end caps 130 and 140 form a direct extension of the hollow member 155, and the other openings 138 and 148 per receptacle space 120 provide openings respectively to a hollow spaces that exist between the surfaces of the shim elements 160 and the carrier device 150 at one side and the surface of the receptacle space 120 at the other side. Corresponding devices can be connected to the openings 135, 138, 145 and 148 for conducting a coolant that is liquid or gaseous at room temperature through the hollow space and the hollow members 155, 156 and 157. With the circulation of the coolant, the shim elements 160 can be maintained at an approximately constant temperature value independently of the particular imaging-dependent operating condition of the magnetic resonance apparatus, so that the homogenizing effect of the shim elements 160 on the basic magnetic field can be kept constant independently of the particular imaging-dependent operating condition of the magnetic resonance apparatus. In particular, degradation of the basic magnetic field homogeneity as a consequence of a heating of the shim elements 160 can be avoided.

Figure 3:
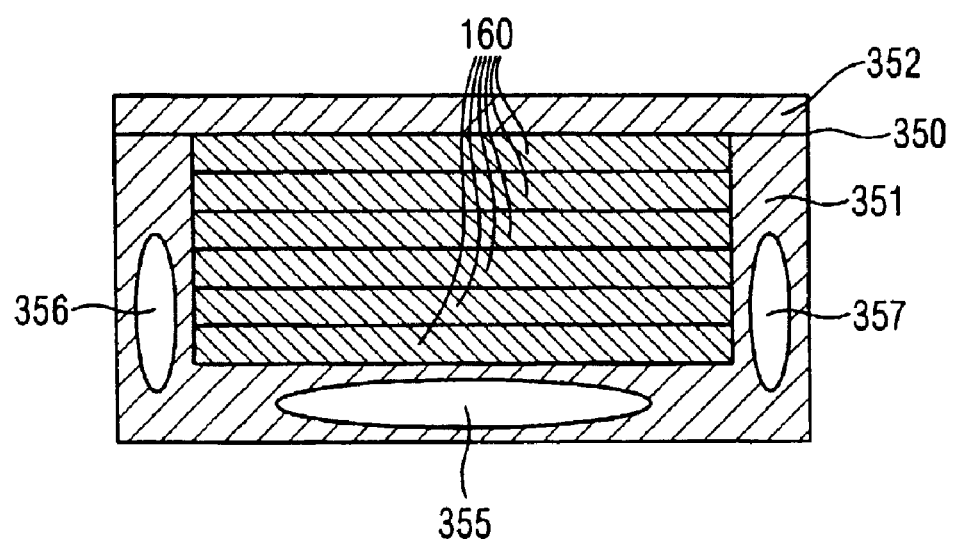
FIG. 3 is a cross-section through a carrier device equipable with shim elements according to the invention.

As a further exemplary embodiment of the invention, FIG. 3 shows a cross-section through a further carrier device 350 equipped with shim elements 160 that, compared to the carrier devices 150 of FIGS. 1 and 2, is composed of a box-shaped base unit 351 with a cover 352. The bottom plate and the two walls of the box-like base unit 351 are designed to form the hollow members 355, 356 and 357 for conducting a coolant through. The carrier device 350 of FIG. 3 is employed with suitably adapted end caps corresponding to the carrier devices 150 of FIGS. 1 and 2.

Figure 4:
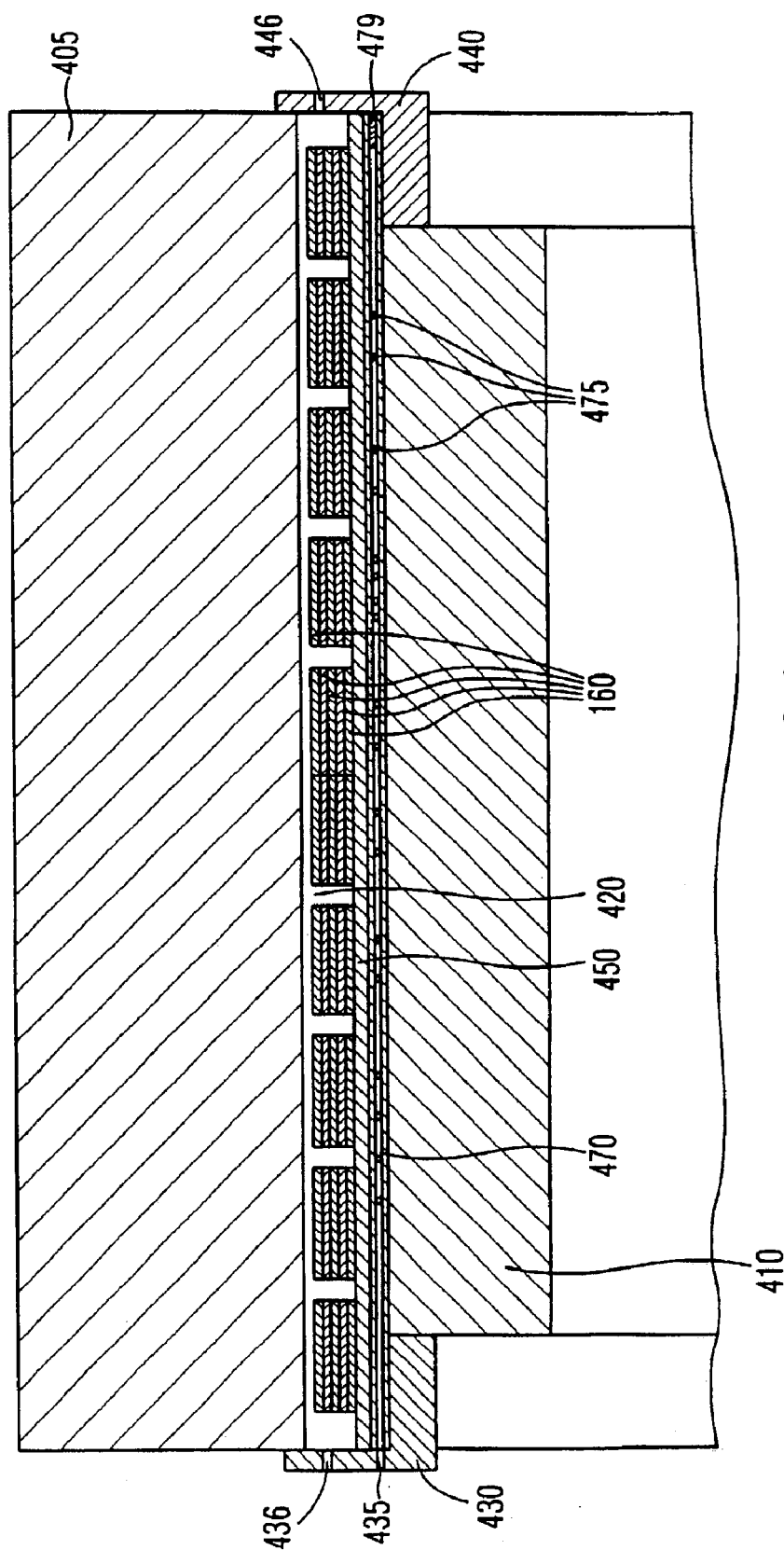
FIG. 4 is a longitudinal section through an upper region of a further embodiment of a magnetic resonance apparatus.
Figure 5:
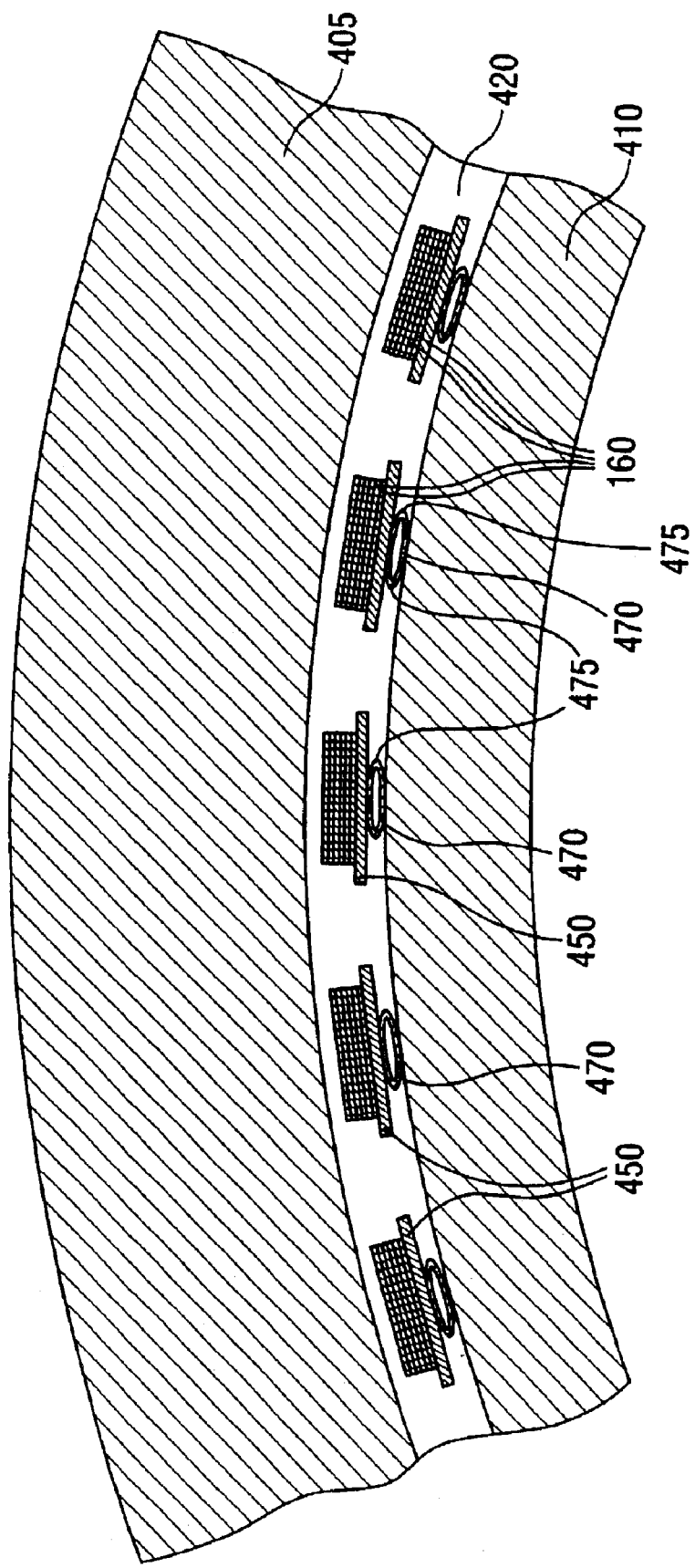
FIG. 5 is a sector of the upper region of FIG. 4, shown as cross-section through the middle of the magnetic resonance apparatus.

As a further exemplary embodiment of the invention, FIG. 4 again shows a longitudinal section through an upper region of a further magnetic resonance apparatus. FIG. 5 thereby shows a sector of the upper region of the apparatus of FIG. 4 as a cross-section through the middle of the further magnetic resonance apparatus. In contrast to the magnetic resonance apparatus of FIGS. 1 and 2, an essentially hollow-cylindrical free space remains between an essentially hollow-cylindrical basic field magnet 405 and a likewise essentially hollow-cylindrical gradient coil system 410 arranged in the interior of the basic field magnet. This free space is used as a receptacle space 420 for carrier devices 450 equipped with shim elements 160. One of the carrier devices 450 is shown longitudinally sectioned in FIG. 4. In the receptacle space 420, pipe-like hollow members 470 that extend in longitudinal direction are permanently installed at the gradient coil system 410 distributed in the circumferential direction of the gradient coil system 410. One of these hollow members 470 is shown longitudinally sectioned in FIG. 4. Particularly in its middle regions, each hollow member 470 has a number of lateral outlet openings 475 and an end closed gas-tight with a blind plug 479.

The hollow-cylindrical receptacle space 420 is closed gas-tight with end rings 430 and 440 at its end faces. The end ring 430 has openings 435 in order, in particular, to be able to insufflate a coolant that is gaseous at room temperature, particularly air, into the pipe-like hollow members 470. The end ring 430 has further openings 436 via which the coolant can be additionally insufflated into the receptacle space 420 left free by the pipe-like hollow members 470 and the carrier devices 450 equipped with shim elements 160. The end ring 440 is provided with openings 446 such that the insufflated coolant can in turn appropriately escape. A uniform introduction of the coolant into the entire receptacle space 420 that remains free is particularly through the pipe-like hollow member 470 provided with lateral outlet openings 475, and thus a uniform cooling of all shim elements 160 is possible. This is a significant advantage, particularly when technological or economic constraints permit only an incomplete tightness of the receptacle space to be achieved by the end rings 430 and 440, and thus an insufflation only via the openings 436 is problematical for cooling purposes.

Although modifications and changes may be suggested by those skilled in the art, it is the intention of the inventors to embody within the patent warranted hereon all changes and modifications as reasonably and properly come within the scope of their contribution to the art.

We claim as our invention:

1. A Magnetic resonance apparatus comprising:

an MRI apparatus component having a receptacle space;

a carrier device disposed in said receptacle space;

said carrier device having a carrier device receptacle with multiple sides which is equipped with MRI shim elements; and said carrier device having a carrier body containing a plurality of hollow conduits therein adapted to conduct a coolant that cools said MRI shim elements, said conduits being disposed in said carrier body respectively adjacent said multiple sides.

2. A magnetic resonance apparatus as claimed in claim 1 wherein said carrier device is a first device and said receptacle space is a first receptacle space, comprising a plurality of carrier devices, including said first carrier device, each carrier device having a carrier body containing a plurality of hollow conduits therein adapted to conduct coolant, and wherein said MRI apparatus component comprises a gradient coil system having a plurality of cylindrical receptacle spaces, including said first receptacle space, that each pass through said gradient coil system, each cylindrical receptacle space accepting one of said plurality of carrier devices.

3. A magnetic resonance apparatus as claimed in claim 1 having a longitudinal axis, and wherein said hollow conduits have a closed longitudinal end in said carrier body and lateral outlet openings in said carrier body for said coolant.

4. A magnetic resonance apparatus as claimed in claim 3 wherein said outlet openings are distributed over a longitudinal length of said hollow conduits.

5. A magnetic resonance apparatus as claimed in claim 1 wherein said carrier body is composed of a material selected from the group consisting of corrosion-resistant stainless steel and brass.

6. A magnetic resonance apparatus as claimed in claim 1 wherein said carrier device is a first device, comprising: a plurality of carrier devices, including said first carrier device, each having a carrier body containing a plurality of hollow conduits therein adapted to conduct coolant, and wherein said MRI apparatus component comprises a gradient coil system and a basic field magnet with a hollow-cylindrical receptacle space there between, forming said receptacle space, and accepting said plurality of carrier devices.

7. A magnetic resonance apparatus as claimed in claim 6 wherein said gradient coil system has a longitudinal extent and wherein said basic field magnet has a longitudinal extent, and wherein said receptacle space, said carrier devices and said hollow conduits have a longitudinal extent approximately equal to one of said longitudinal extent of said gradient coil system and said longitudinal extent of said basic field magnet.

8. A magnetic resonance apparatus as claimed in claim 1 wherein said carrier body is comprised of highly thermally conductive plastic.

9. A magnetic resonance apparatus as claimed in claim 1 wherein said carrier body has a body surface adapted to support said shim elements and wherein hollow conduits are disposed at minimum structural distance from said body surface.

10. A magnetic resonance apparatus as claimed in claim 1 having a longitudinal axis, and wherein said receptacle space has a longitudinal extent along said longitudinal axis, and wherein said carrier body and said hollow conduits each have a longitudinal extent approximately equal to said longitudinal extent of said receptacle space.

11. A magnetic resonance apparatus as claimed in claim 1 wherein said hollow conduits have a cross-section selected from the group consisting of a circular cross-section and an oval cross-section.

12. A magnetic resonance apparatus as claimed in claim 1 comprising a gradient coil system, an antenna device and a basic field magnet, and wherein said receptacle space is limited by a surface of at least one of said gradient coil system, said antenna device and said basic field magnet.

13. A magnetic resonance apparatus as claimed in claim 1 wherein said receptacle space is closed to form a hollow channel adapted to conduct coolant.

14. A magnetic resonance apparatus as claimed in claim 13 wherein said receptacle space has end openings, and comprising end caps fitted in said end openings to close said end opening.

15. A magnetic resonance apparatus as claimed in claim 1 wherein said hollow conduits adapted to conduct a coolant that is gaseous at room temperature.

16. A magnetic resonance apparatus as claimed in claim 1 wherein said hollow conduits are adapted to conduct a coolant that is liquid at room temperature.

17. A carrier device comprising:
   A carrier device body having a carrier device receptacle with multiple sides adapted to be equipped with MRI shim elements, said carrier device body containing a plurality of hollow conduits therein adapted to conduct a coolant there through that cools said MRI shim elements, said conduits being disposed in said carrier body respectively adjacent said multiple sides.

18. A carrier device as claimed in claim 17 wherein said carrier device body has a surface adapted to receive said MRI shim elements thereon, and wherein said hollow conduits are disposed at a structurally minimum distance from said surface.

19. A carrier device as claimed in claim 17 wherein said carrier device body consists of a highly thermally conductive plastic.

* * * * *